United States Patent
Kim

(10) Patent No.: US 6,459,311 B1
(45) Date of Patent: Oct. 1, 2002

(54) FREQUENCY DOUBLER CIRCUIT HAVING DETECT-CONTROL UNIT FOR IMPROVING FREQUENCY DOUBLING PERFORMANCE

(75) Inventor: Joung-ho Kim, Kyungki-do (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/849,572

(22) Filed: May 4, 2001

(30) Foreign Application Priority Data

Sep. 26, 2000 (KR) .............................. 00-56425

(51) Int. Cl.[7] .............................................. H03B 19/00
(52) U.S. Cl. ....................................... 327/122; 327/119
(58) Field of Search ............................. 327/116, 119, 327/122; 377/47, 48

(56) References Cited

U.S. PATENT DOCUMENTS

| | | | | |
|---|---|---|---|---|
| 4,951,000 A | * | 8/1990 | Dautriche | 327/236 |
| 5,151,624 A | * | 9/1992 | Stegherr et al. | 327/356 |
| 5,548,236 A | * | 8/1996 | Copper et al. | 327/231 |
| 5,963,073 A | * | 10/1999 | Fujita et al. | 327/155 |
| 6,181,181 B1 | * | 1/2001 | Tsukahara et al. | 213/113 |
| 6,366,148 B1 | * | 4/2002 | Kim | 327/254 |

* cited by examiner

Primary Examiner—Tuan T. Lam
Assistant Examiner—Cassandra Cox
(74) Attorney, Agent, or Firm—F. Chau & Associates, LLP

(57) ABSTRACT

A frequency doubler circuit implemented in an integrated circuit and having improved doubling performance is provided. The frequency doubler circuit including a phase shifter, a first buffer, a second buffer, a detect-control unit, a third buffer, a fourth buffer, a multiplier and an output buffer. The phase shifter outputs, in response to an input signal having a predetermined frequency, a first signal which is in phase with the input signal and a second signal which is out-of-phase from the input signal. The first buffer filters and buffers the first signal, and the second buffer filters and buffers the second signal. The detect-control unit detects a phase difference between the first and second signals in response to the first signal, the second signal, the output signal of the first buffer and the output signal of the second buffer, and outputs first and second control signals. The third buffer buffers the output signal of the first buffer in response to the first control signal, and the fourth buffer buffers the output signal of the second buffer in response to the second control signal. The multiplier multiplies the output signals of the third and fourth buffers. The second signal differs from the first signal by about 90°.

12 Claims, 4 Drawing Sheets

FREQUENCY DOUBLER CIRCUIT HAVING DETECT-CONTROL UNIT FOR IMPROVING FREQUENCY DOUBLING PERFORMANCE

BACKGROUND OF THE INVENTION

1. Field of the Invention

The present invention relates to an integrated circuit, and more particularly, to a frequency doubler circuit implemented in an integrated circuit.

2. Description of the Related Art

Frequency doubling circuits are often used in phase locked loops for synthesizing a clock signal related in phase to an input signal. Frequency doubling of input signals at low frequency can be realized by use of a switching capacitor, a differential amplifier, an emitter-coupled transistor pair having different emitter area ratios (W/L), and using signal delay by logic gates and flip-flops.

At higher frequencies, implementation of frequency doubling of an input signal becomes difficult.

Conventional methods of doubling an input signal having a predetermined frequency in a high-frequency region include using the product of an input signal IN and a quart-shifted signal of the input signal IN, and using a micro strip line having a quarter-wave length of the input signal IN and the second harmonic frequency to the input signal IN.

However, a micro strip line cannot easily be put in an IC without affecting the operations and placement of other components in the IC.

FIG. 1 shows a conventional frequency doubler circuit, having a plurality of amplifiers 11, 13 and 19, a phase shifter 17 and a multiplier 15. The amplifiers 11 and 13 amplify an input signal IN, which operates at a predetermined frequency fo. Signal IN is output from a voltage controlled oscillator (VCO) of a phase locked loop (PLL). Signal I output for amplifier 13 is fed into a phase shifter 17, which phase shifts signal I by $\pi/2$ or 90° to form signal Q. Multiplier 15 multiplies I with the $\pi/2$ phase-shifted signal Q. The output of multiplier 15 is a signal having a frequency which is double of frequency fo, i.e., 2fo. This signal is amplified by amplifier 19 and then the amplified signal is applied to a local oscillator (LO) of a mixer.

A problem occurs with the circuit of FIG. 1 when there is a mismatch in the gain of I and Q or a mismatch in the phase between the two signals I and Q. This can result from a change in the processing condition or temperature.

Further, harmonics of the frequency fo and modulated frequency components can result due to non-linearity of active elements. When pumped to an LO (not shown) of a mixer, the harmonics of the doubled frequency signal may adversely affect the sensitivity characteristic of a system.

Accordingly, a need exists for a frequency doubler circuit which is easily implemented in an integrated circuit (IC) and having improved frequency doubling performance at a higher frequency region.

A need also exists for a detect-control unit for improving the frequency doubling performance even when there are changes in the processing condition or temperature.

SUMMARY OF THE INVENTION

A frequency doubler circuit is provided, the circuit including a phase shifter, a first buffer, a second buffer, a detect-control unit, a third buffer, a fourth buffer, a multiplier and an output buffer. The phase shifter outputs, in response to an input signal having a predetermined frequency, a first signal which equals to the input signal in phase and a second signal which differs from the input signal in phase. The first buffer filters and buffers the first signal, and the second buffer filters and buffers the second signal. The detect-control unit detects a phase difference between the first and second signals in response to the first signal, the second signal, the output signal of the first buffer and the output signal of the second buffer, and outputs first and second control signals.

The third buffer buffers the output signal of the first buffer in response to the first control signal, and the fourth buffer buffers the output signal of the second buffer in response to the second control signal.

The multiplier multiplies the output signals of the third and fourth buffers. The output buffer buffers the output signal of the multiplier.

Preferably, the second signal differs from the first signal in phase by about 90° and the output signal of the fourth buffer differs from the output signal of the third buffer in phase by about 90°.

Also, preferably, the filters of the first and second buffers are high pass filters, and the output filter of the output buffer is a band pass filter.

To achieve the second object, there is provided a detection controlling apparatus for controlling, in response to an input signal having a predetermined frequency, a first signal which equals to the input signal in phase and a second signal which differs from the input signal in phase, to be multiplied, the detection controlling apparatus including a phase detector, a converter and a driving buffer. The phase detector outputs a voltage which is proportional to a phase difference between the first signal and the second signal in response to the first and second signals. The converter generates current which is proportional to the output voltage in response to the output voltage of the phase detector network. The driving buffer buffers the output signal of the converter in response to the output signals of the first and second buffers, and outputs the first control signal for controlling the third buffer and the second control signal for controlling the fourth buffer.

BRIEF DESCRIPTION OF THE DRAWINGS

A better understanding of the present invention can be obtained through the brief description of the following drawings, in which.

DESCRIPTION OF PREFERRED EMBODIMENTS

Figure 1:
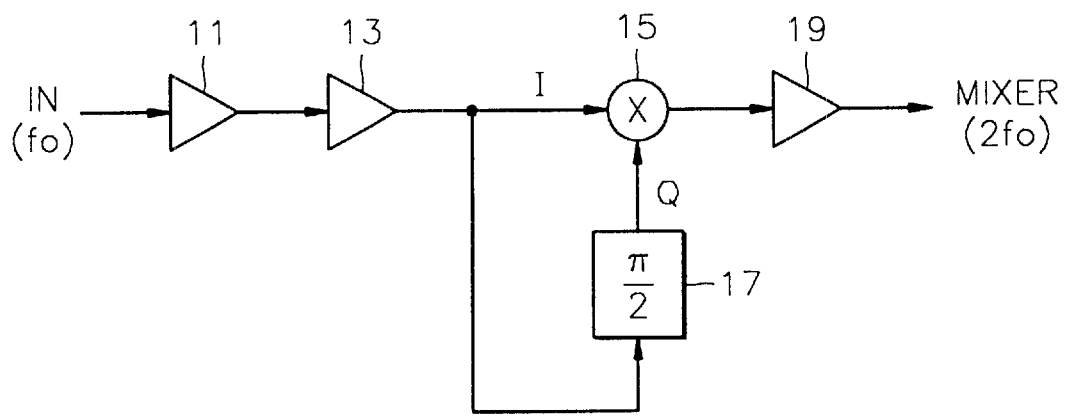
FIG. 1 shows a conventional frequency doubler circuit.

For a fully understanding of the above objects and advantages of the present invention, reference is made to the following disclosures of a preferred embodiment in conjunction with the attached drawings.

The present invention will now be described in detail by describing a preferred embodiment thereof with reference to the accompanying drawings. The same reference numerals of the drawings denote the same elements.

Figure 2:
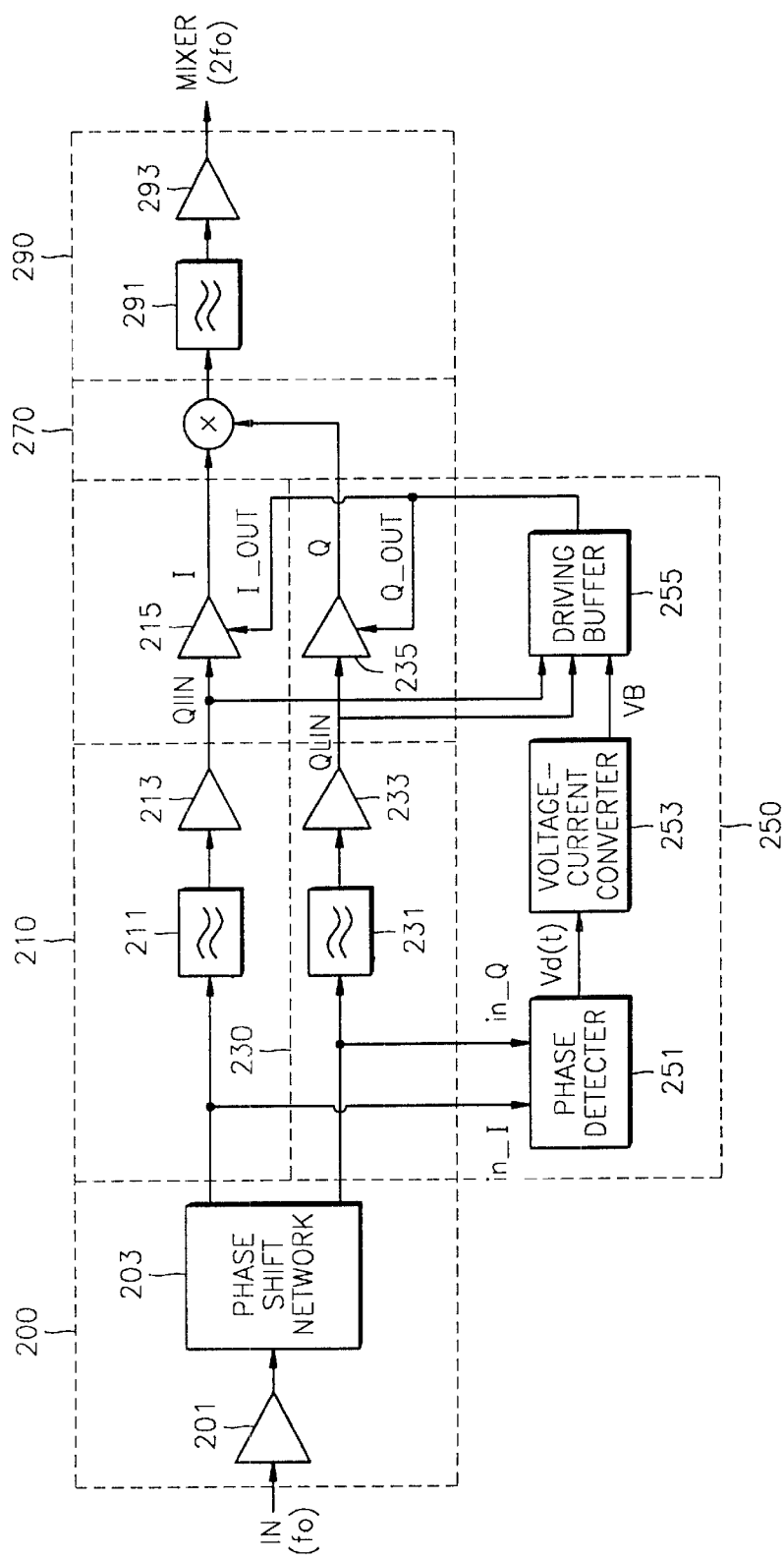
FIG. 2 is a schematic block diagram illustrating a frequency doubler circuit according to an embodiment of the present invention.

FIG. 2 is a schematic block diagram illustrating a frequency doubler circuit according to an embodiment of the present invention. The frequency doubler circuit includes a phase shifter 200, a first buffer 210, a second buffer 230, a detect-control unit 250, a third buffer 215, a fourth buffer 235, a multiplier 270 and an output buffer 290.

The phase shifter 200 includes an amplifier 201 and a phase shift network 203. The amplifier 201 amplifies the signal level of an input signal IN. Signal IN operates at frequency fo output from a VCO (not shown). In general, an input signal should be maintained at an amplitude of 500 mV or higher to obtain the minimum phase-error characteristic.

To minimize the transfer of noise having a frequency lower than or equal to a reference frequency, the phase shift network 203 outputs a first signal in_I which is in phase with the input signal IN referred to herein as "in-phase signal", and a second signal in_Q which differs in phase from the input signal IN, referred herein as "out-of-phase signal".

The first buffer 210 filters the first signal in_I and buffers the same. The first buffer 210 includes a filter 211 and an amplifier (or limiter) 213. The filter 211 is preferably a high pass filter (HPF) for eliminating low-frequency noise contained in the first signal in_I, and a high-pass-filtered signal is output to the amplifier 213.

The second buffer 230 filters the second signal in_Q quarter-shifted from the first signal in_I and buffers the same. The second buffer 210 includes a filter 231 and an amplifier (or limiter) 233. The filter 231 is also preferably of an HPF for eliminating low-frequency noise contained in the second signal in_Q, and a high-pass-filtered signal is output to the amplifier 233.

The detect-control unit 250 shown in FIG. 2 includes a phase detector 251, a voltage-current converter 253 and a driving buffer 255.

The phase detector 251 detects the phase difference between the signals input in _I and in_Q and provides a voltage Vd(t), which is proportional to the phase difference between the two signals. The voltage Vd(t) is input to the voltage-current converter 253, which generates current proportional to Vd(t).

According to the present embodiment of the invention, the detector detects the phases and frequencies of the first signal in _I and the second signal in _Q. The driving buffer 255 outputs a first differential control signal I_OUT for controlling the third buffer 215 and a second differential control signal Q_OUT for controlling the fourth buffer 235, in response to a differential output signal QIIN of the first buffer 210 or a differential output signal QLIN of the second buffer 230.

According to another embodiment of the present invention, the detect-control unit 250 may include a phase-frequency detector (not shown) for detecting phase and frequency and a driving buffer 255.

The third buffer 215 buffers the output signal QIIN of the first buffer 210 under control by the first differential control signal I_OUT of the driving buffer 255, and outputs a signal I which is in phase with the input signal IN.

The fourth buffer 235 buffers the output signal QLIN of the second buffer 230 under control by the second differential control signal Q_OUT of the driving buffer 255, and outputs a signal Q which is out-of-phase from the input signal IN by about π/2.

Thus, the first differential control signal I_OUT or the second differential control output signal Q_OUT controls the signal I or Q to have a phase difference of π/2. The third buffer 215 and the fourth buffer 235 are preferably an amplifier or a limiter.

To minimize an increase in the harmonic distortion when noise is generated due to transistor switching of the multiplier 270, or from the levels of the input signals in_I, in_Q or QIIN and QLIN being too large, the amplifier 213 of the first buffer 210, the third buffer 215, the amplifier 233 of the second buffer 230 and the fourth buffer 235 convert the input signals in_I and in_Q or QIIN and QLIN into level-compensated signals I and Q. The amplitude matching of the input signals I and Q of the multiplier 270 minimizes the load effect in power matching with the transistor of the multiplier 270.

The multiplier 270 multiplies the signal I of the third buffer 215, that is, cos ωt, with the signal Q of the fourth buffer 235 phase-shifted from the signal I by π/2, that is, cos(ωt−π/2). The product of cos ωt·cos(ωt−π/2) is cos 2ωt. That is, a signal having twice the frequency, i.e., 2fo, of the input frequency fo of the input signal IN.

The output buffer 290 buffers the output signal cos 2ωt of the multiplier 270 and outputs the signal having a frequency of 2fo to a mixer. The output buffer 290 includes an output filter 291 and an amplifier 293. The output signal cos 2ωt contains many harmonics as well as the doubled frequency 2fo of the input signal frequency fo. Thus, the output filter 291 includes a band pass filter (BPF) 291 having a central frequency of 2fo for filtering the extraneous harmonics. The signal 2fo having passed through the BPF 291 is an LO signal of the mixer and is input to a matching amplifier 293 for pumping.

Figure 3:
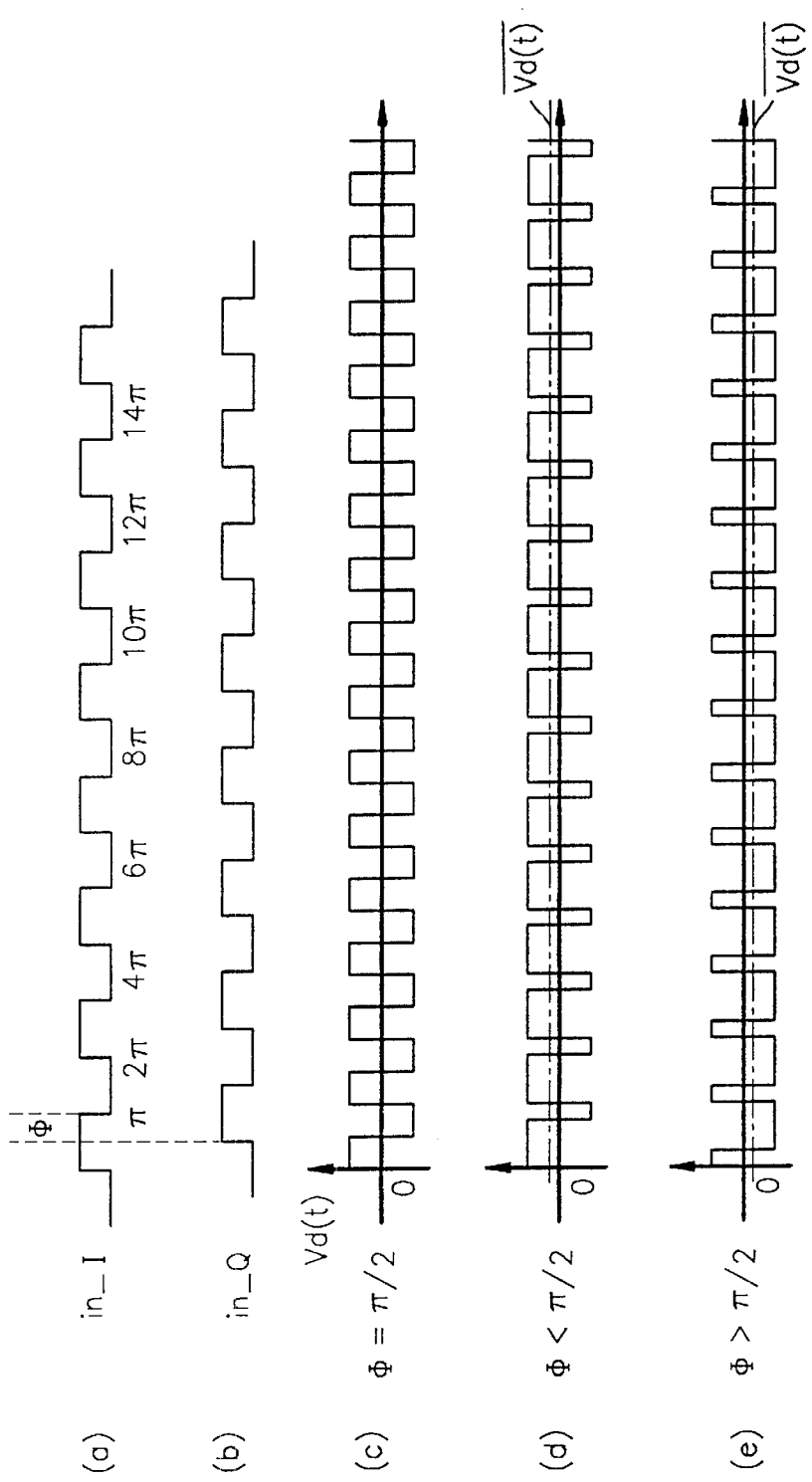
FIG. 3 shows waveforms output from a phase detector shown in FIG. 2.

FIG. 3 shows output waveforms of the phase detector 251 of FIG. 2. FIG. 3(a) shows a waveform of the first signal in_I, in which φ denotes a phase difference between the first signal in_I and the second signal in_Q shown in FIG. 3(b). FIG. 3(c) shows the output Vd(t) of the phase detector 251 in the case where the phase difference φ is π/2, and the output is indicated as a change in the DC voltage /Vd(t). The variation of the DC voltage /Vd(t) can be controlled by the change in the output voltage Vd(t) of the phase detector 251. The phase shift values are provided as the input control signal I_OUT and Q_OUT of the multiplier 270 through the driving buffer 255.

FIG. 3(d) shows that the phase difference φ is smaller than the reference phase π/2, and FIG. 3(e) shows that the phase difference φ is larger than the reference phase π/2. Also, /Vd(t) denotes a DC level of the phase detector 251.

Figure 4:
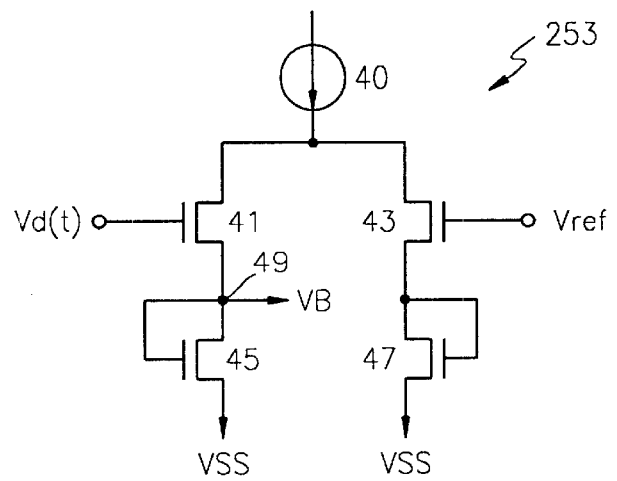
FIG. 4 is a schematic circuit diagram of the voltage-current converter of FIG. 2.

FIG. 4 is a schematic circuit diagram of the voltage-current converter 253 of FIG. 2. The voltage-current converter 253 includes an nMOS transistor 43 having a drain connected to a current source 40 and a gate to which a reference voltage Vref is supplied, an nMOS transistor 47 having a drain and gate commonly connected to a source of the nMOS transistor 43 and a source connected to a ground voltage, an nMOS transistor 41 having a drain connected to the current source 40 and a gate to which the output voltage Vd(t) of the phase detector 251 is supplied, and an nMOS transistor 45 having a drain and gate commonly connected to the source of the nMOS transistor 41 and a source connected to a ground. An output node 49 of the voltage-current converter 253 is connected to the source of the nMOS transistor 41 and the drain of the nMOS transistor 45.

The transistors 41 and 43 is turned on or off dependent upon Vd(t) or the reference voltage Vref. The transistors 41 and 43 allow constant current to flow according to the state thereof. Also, the voltage VB of the output node 49 varies according to the level of the output voltage Vd(t).

Figure 5:
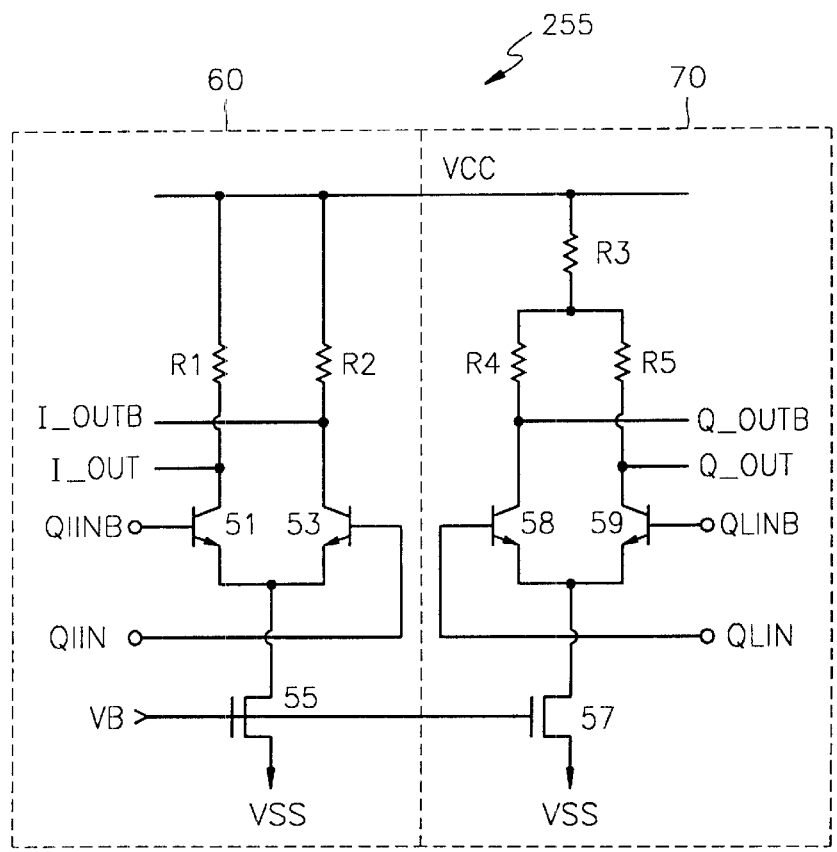
FIG. 5 is a schematic circuit diagram of the driving buffer of FIG. 2.

FIG. 5 is a schematic circuit diagram of the driving buffer 255 of FIG. 2. The driving buffer 255 includes a first differential comparator 60 and a second differential comparator 70.

The first differential comparator 60 outputs first differential control signals I_OUT and I_OUTB for controlling the third buffer 215 in response to the output 40 signal VB of the voltage-current converter 253 and the differential output signals QIIN and QIINB of the amplifier 213 of the first buffer 210. The second differential comparator 70 outputs second differential control signals Q_OUT and Q_OUTB for controlling the fourth buffer 235 in response to the output signal VB of the voltage-current converter 253 and the differential output signals QLIN and QLINB of the amplifier 233 of the second buffer 230.

The first differential comparator 60 includes a resistor R1 having one end connected to a power supply voltage VCC, a resistor R2 having one end connected to the power supply voltage VCC, a first transistor 51 having a collector connected to the other end of the resistor R1 and a gate to which the differential output signals QIIN and QIINB of the amplifier (or limiter) 213 of the first buffer 210 are supplied, a second transistor 53 having a collector connected to the other end of the resistor R2 and a gate to which the differential output signals QIIN and QIINB of the amplifier 213 of the first buffer 210, and an nMOS transistor 55 having a gate to which the output voltage VB of the voltage-current converter 253 is supplied and a drain commonly connected to emitters of the first and second transistors 51 and 53 and a source connected to the ground power supply VSS. The collector of the first transistor 51 and the collector of the second transistor 53 output the first control signals I_OUT and I_OUTB to the third buffer 215.

The second differential comparator 70 includes a resistor R3 having one end connected to a power supply voltage VCC, a resistor R4 having one end connected to the other end of the resistor R3, a resistor R5 having one end connected to the other end of the resistor R3, a third transistor 58 having a collector connected to the other end of the resistor R4 and a gate to which the differential output signals QLIN and QLINB of the amplifier 233 of the third buffer 230 are supplied, a fourth transistor 59 having a collector connected to the other end of the resistor R5 and a gate to which the differential output signals QLIN and QLINB of the amplifier 233 of the third buffer 230, and an nMOS transistor 57 having a gate to which the output voltage VB of the voltage-current converter 253 is supplied and a drain commonly connected to emitters of the third and fourth transistors 58 and 59 and a source connected to the ground power supply VSS. The collector of the third transistor 58 and the collector of the fourth transistor 59 output the second control signals Q_OUT and Q_OUTB to the fourth buffer 235.

The differential output signals I_OUT and I_OUTB of the first differential comparator 60 are determined in response to the signal VB of the voltage-current converter 253, which is applied to the gate of the nMOS transistor 55, and the differential output signals QIIN and QIINB of the first buffer 210. The differential output signals I_OUT and I_OUTB of the first differential comparator 60 are input to the third buffer 215 to control the third buffer 215.

Also, the differential output signals Q_OUT and Q_OUTB of the second differential comparator 70 are determined in response to the output signal VB of the voltage-current converter 253, applied to the gate of the nMOS transistor 57, and the differential output signals QLIN and QLINB of the second buffer 230. The differential output signals Q_OUT and Q_OUTB of the second differential comparator 70 are input to the fourth buffer 235 to control the fourth buffer 235.

Thus, the third buffer 215 outputs a signal I which is in phase with the input signal IN in response to the first control signals I_OUT and I_OUTB.

The fourth buffer 235 outputs a signal Q which is out-of-phase from the input signal IN by about $\pi/2$, in response to the second control signals Q_OUT and Q_OUTB.

Thus, the output signal I of the third buffer 215 and the output signal Q of the fourth buffer 235 are adjusted to have a phase difference of about $\pi/2$ to then be input to the multiplier 270. The multiplier 270 multiplies the signals I and Q and outputs a signal having a doubled frequency (2fo) of the input signal frequency (fo) to a mixer.

Consequently, changes in the conditions such as frequency, temperature or parameters of the signals in_I and in_Q of the phase shift network 203 cause corresponding changes in the phases of the signals I and Q, which deteriorates the characteristics of the multiplier 270 in generating a double frequency of the input signal IN.

To compensate for the characteristic of the multiplier 270, the phase detector 251 outputs a voltage Vd(t), which is proportional to a phase difference between the first signal in_I and the second signal in_Q, to the voltage-current converter 253.

When there is a change in a phase difference different from the reference phase $\pi/2$ as shown in FIG. 3, the variation of the DC voltage depending on the phase change $\phi$ produces a changed Vd(t) of the phase detector 251, which in turn causes changes in control signals I_OUT and Q_OUT, compensating for the changes to signal I and Q input to the multiplier 270. Thus, a constant frequency doubling characteristic is achieved despite changes in the conditions such as frequency, temperature and parameters of a phase-shifted signal.

Therefore, the frequency doubler circuit according to an embodiment of the present invention improves the carrier to noise ratio (CNR) of harmonics relative to an LO signal of the mixer, that is, a 2fo signal.

As described above, the illustrative frequency doubler circuit according to a preferred embodiment of the present invention is implemented by an IC and improves the frequency doubling performance at a higher frequency domain by accurately adjusting a phase difference between the signals I and Q to $\pi/2$ despite changes in temperature and other parameters such as processing variations.

Although particular terms have been used herein for the purpose of explaining the present invention, there is no intent to limit the invention thereto. Thus, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A frequency doubler circuit comprising:
 a phase shifter for outputting, in response to an input signal having a predetermined frequency, a first signal which is in phase with the input signal and a second signal which is out-of-phase from the input signal;
 a detect-control unit for detecting a phase difference between the first and second signals and for outputting first and second control signals;

a first signal controller for receiving the first signal and adjusting the first signal based on the first control signal;

a second signal controller for receiving the second signal and adjusting the second signal based on the second control signal; and a multiplier for multiplying the output signals of the first signal controller and the second signal controller to form an output signal having a frequency that is about double of the predetermined frequency.

2. The frequency doubler circuit according to claim 1, wherein the detect-control unit comprises:

a phase detector for outputting a phase detect voltage which is proportional to a phase difference between the first signal and the second signal; and a converter for generating a converter signal proportional to the phase detect voltage; and a driving buffer for buffering the converter signal in response to the first and second signals, and outputting the first control signal for controlling the first signal controller and the second control signal for controlling the second signal controller.

3. The frequency doubler circuit according to claim 1, further including a filter for filtering the first signal and an amplifier for buffering the output signal of the filter.

4. The frequency doubler circuit according to claim 1, further including a filter for filtering the second signal and an amplifier for buffering the output signal of the filter.

5. The frequency doubler circuit according to claim 1, further including an output buffer comprising an output filter for filtering the output signal of the multiplier and an amplifier for buffering the output signal of the output filter.

6. The frequency doubler circuit according to claim 1, wherein the second signal differs in phase from the first signal by about 90°.

7. The frequency doubler circuit according to claim 1, wherein the output signal of the first signal controller is out-of-phase from the output signal of the second signal controller by about 90°.

8. The frequency doubler circuit according to claim 3, wherein the filter is a high pass filter.

9. The frequency doubler circuit according to claim 4, wherein the filter is a high pass filter.

10. The frequency doubler circuit according to claim 5, wherein the output filter is a band pass filter.

11. The frequency doubler circuit according to claim 2, wherein the converter comprises:

a first MOS transistor having a drain connected to a current source and a gate to which a reference voltage is supplied;

a second MOS transistor having a drain and gate commonly connected to a source of the first MOS transistor and a source connected to a ground voltage;

a third MOS transistor having a drain connected to the current source and a gate to which the output voltage of the phase detector is supplied; and a fourth MOS transistor having a drain and gate commonly connected to a source of the third MOS transistor and a source connected to the ground voltage, and wherein the output node of the converter is connected to the source of the third MOS transistor.

12. The frequency doubler circuit according to claim 11, wherein the driving buffer comprises:

a first differential comparator for outputting first differential control signals for controlling the first signal controller; and a second differential comparator for outputting second differential control signals for controlling the second signal controller.

* * * * *